(12) United States Patent
Thomas et al.

(10) Patent No.: US 10,753,979 B2
(45) Date of Patent: Aug. 25, 2020

(54) IN-SITU BATTERY MONITORING SYSTEM

(71) Applicant: THE BOEING COMPANY, Chicago, IL (US)

(72) Inventors: Terrance L. Thomas, Covington, WA (US); Lowell W. Schaffner, Seattle, WA (US); Mori M. Borumand, Woodinville, WA (US)

(73) Assignee: The Boeing Company, Chicago, IL (US)

( * ) Notice: Subject to any disclaimer, the term of this patent is extended or adjusted under 35 U.S.C. 154(b) by 1117 days.

(21) Appl. No.: 13/856,989

(22) Filed: Apr. 4, 2013

(65) Prior Publication Data
US 2014/0300363 A1    Oct. 9, 2014

(51) Int. Cl.
| | |
|---|---|
| G01N 27/416 | (2006.01) |
| G01R 31/382 | (2019.01) |
| G01R 31/389 | (2019.01) |
| G01R 31/11 | (2006.01) |
| G01R 31/00 | (2006.01) |
| G01R 31/392 | (2019.01) |

(52) U.S. Cl.
CPC ......... *G01R 31/382* (2019.01); *G01R 31/389* (2019.01); *G01R 31/008* (2013.01); *G01R 31/11* (2013.01); *G01R 31/392* (2019.01)

(58) Field of Classification Search
CPC . G01R 31/3606; G01R 31/382; G01R 31/389
USPC ....................................................... 324/426
See application file for complete search history.

(56) References Cited

U.S. PATENT DOCUMENTS

| | | | |
|---|---|---|---|
| 4,053,824 A | 10/1977 | Dupuis et al. | |
| 4,759,034 A * | 7/1988 | Nagazumi | H04B 1/7093 |
| | | | 375/142 |

(Continued)

FOREIGN PATENT DOCUMENTS

| | | |
|---|---|---|
| CN | 101498765 | 8/2009 |
| CN | 101573851 | 11/2009 |

(Continued)

OTHER PUBLICATIONS

The Next Generation of DSL Can Pump 1Gbps Through Copper Phone Lines <http://gizmodo.com/the-next-generation-of-dsl-can-pump-1gbps-through-coppe-1484256467>.*

(Continued)

*Primary Examiner* — Zixuan Zhou
(74) *Attorney, Agent, or Firm* — Haynes and Boone LLP (57) ABSTRACT

The present disclosure provides a system, method, and apparatus for battery monitoring. In one or more embodiments, the disclosed method involves injecting at least one test signal into a battery, and receiving at least one response signal from the battery. In one or more embodiments, the response signal(s) comprises at least one reflected signal. The method further involves comparing, with at least one processor, the response signal(s) with at least one baseline signal to produce at least one comparison signal. Also, the method involves detecting, with at least one processor, at least one anomaly within the battery by using the comparison signal(s). Further, the method involves determining, with at least one processor, a location at least one anomaly within the battery by using the comparison signal(s).

24 Claims, 9 Drawing Sheets

(56) References Cited

U.S. PATENT DOCUMENTS

| | | | |
|---|---|---|---|
| 5,949,219 A * | 9/1999 | Weiss | G01N 21/31 |
| | | | 320/136 |
| 6,005,842 A * | 12/1999 | Goodman | H04J 3/085 |
| | | | 370/221 |
| 6,225,810 B1 | 5/2001 | Godo et al. | |
| 6,532,255 B1 * | 3/2003 | Gunzelmann | G01S 19/22 |
| | | | 342/357.61 |
| 6,717,786 B2 | 4/2004 | Holley et al. | |
| 6,932,621 B2 | 8/2005 | Anderson et al. | |
| 7,005,995 B2 | 2/2006 | Hornsby et al. | |
| 7,010,441 B2 * | 3/2006 | Galli | G01R 31/11 |
| | | | 702/57 |
| 7,069,163 B2 | 6/2006 | Gunther et al. | |
| 7,075,309 B2 | 7/2006 | Smith | |
| 7,165,200 B2 | 1/2007 | Jani et al. | |
| 7,215,126 B2 | 5/2007 | Furse et al. | |
| 7,250,772 B2 | 7/2007 | Furse et al. | |
| 7,271,596 B2 | 9/2007 | Furse et al. | |
| 7,436,641 B2 | 10/2008 | Holley | |
| 7,474,228 B2 * | 1/2009 | Lockhart | G01R 31/3648 |
| | | | 324/433 |
| 7,570,470 B2 | 8/2009 | Holley | |
| 7,580,235 B2 | 8/2009 | Hamasaki et al. | |
| 7,622,931 B2 | 11/2009 | Wu et al. | |
| 7,656,637 B2 | 2/2010 | Mcavoy et al. | |
| 7,868,621 B2 | 1/2011 | Liu et al. | |
| 7,977,949 B2 | 7/2011 | Williams | |
| 8,022,711 B2 | 9/2011 | Oldenburg et al. | |
| 8,043,452 B2 | 10/2011 | Larsen et al. | |
| 8,406,936 B1 | 3/2013 | Borumand et al. | |
| 8,891,218 B2 | 11/2014 | Holley et al. | |
| 2001/0033605 A1 * | 10/2001 | Gunzelmann | H04B 1/7085 |
| | | | 375/148 |
| 2002/0147561 A1 | 10/2002 | Baracat et al. | |
| 2004/0230385 A1 * | 11/2004 | Bechhoefer | G01R 31/11 |
| | | | 702/57 |
| 2005/0151657 A1 * | 7/2005 | Lockhart | G01R 19/16542 |
| | | | 340/636.1 |
| 2005/0213867 A1 | 9/2005 | Rajendran et al. | |
| 2006/0213766 A1 * | 9/2006 | You | C25C 7/06 |
| | | | 204/228.1 |
| 2010/0057511 A1 | 3/2010 | Mansouri et al. | |
| 2010/0063754 A1 | 3/2010 | Thomas et al. | |
| 2010/0134061 A1 | 6/2010 | Mansouri | |
| 2010/0211338 A1 | 8/2010 | Ravot et al. | |
| 2011/0153235 A1 | 6/2011 | Thomas et al. | |
| 2011/0181295 A1 | 7/2011 | Haugen et al. | |
| 2012/0074952 A1 * | 3/2012 | Chappell | G01R 31/11 |
| | | | 324/534 |
| 2013/0154541 A1 | 6/2013 | Stickelmaier | |
| 2013/0260188 A1 | 10/2013 | Coates | |

FOREIGN PATENT DOCUMENTS

| | | |
|---|---|---|
| CN | 101740838 | 6/2010 |
| EP | 2343562 | 7/2011 |
| EP | 2343562 A2 | 7/2011 |
| JP | H5-326032 A | 12/1993 |
| JP | H6-290817 A | 10/1994 |
| JP | 2010-539657 A | 12/2010 |
| JP | 2012-69267 A | 4/2012 |
| JP | 2013-134120 A | 7/2013 |
| JP | 2014-59174 A | 4/2014 |
| KR | 2012/0030966 | 3/2012 |
| WO | 2011/091444 A | 7/2011 |
| WO | WO 2011/091444 | 7/2011 |
| WO | 2012/006189 A | 1/2012 |
| WO | WO 2012/006189 | 1/2012 |

OTHER PUBLICATIONS

Office Action from Japanese Patent Office, Patent Application No. JP 2014-071153, dated Apr. 18, 2016. (English translation attached).

SAE Aerospace, "ARC Fault Circuit Breaker 9AFCB), Aircraft, Trip-Free 28 VDC," SAE Technical Report, Jun. 2012, pp. 1-60, AS6019, SAE International, Warrendale, Pennsylvania/USA.

SAE Aerospace, "(R) ARC Fault Circuit Breaker 9AFCB), Aircraft, Trip-Free Single Phase and Three Phase 115 VAC, 400 Hz—Constant Frequency," SAE Technical Report, Dec. 2009, pp. 1-64, AS5692A, SAE International, Warrendale, Pennsylvania/USA.

SAE Aerospace, "Solid State Power Controller, General Standard for," SAE Technical Report, Jul. 2007, pp. 1-32, AS4805, SAE International, Warrendale, Pennsylvania/USA.

Blumer, John, "Advanced Vehicle Wire Health for the 21st Century," SAE Technical Paper Series, Nov. 2004, pp. 1-8, 2004-01-3159, SAE International, Warrendale, Pennsylvania/USA.

Blumer, et al., "Advanced Vehicle Wire Health for the 21st Century", Boeing Publication, 2004.

Extended European Search Report, Application Ser. No. 14157600.9-1560, dated Jul. 31, 2014.

Adrien Lelong, et al., "On Line Wire Diagnosis using Multicarrier Time Domain Reflectometry for Fault Location", Sensors, 2009 IEEE, IEEE, Piscataway, NJ, USA, Oct. 25, 2009, pp. 751-754. XP031618950, ISBN: 978-1-4244-4548-6, the whole document.

Lelong et al., "On Line Wire Diagnosis Using Multicarrier Time Domain Reflectometry for Fault Location," Sensors, 2009 IEEE, IEEE, Piscataway, NJ, USA, Oct. 25, 2009, pp. 751-754. XP031618950, ISBN: 978-1-4244-4548-6.

Office Action from Japanese Patent Office, Patent Application No. JP 2014-071153, dated Apr. 18, 2016.

Office Action from Japanese Patent Office, Patent Application No. JP 2014-071153, dated Oct. 26, 2015.(English translation).

\* cited by examiner

IN-SITU BATTERY MONITORING SYSTEM

BACKGROUND

The present disclosure relates to a monitoring system. In particular, it relates to an in-situ battery monitoring system.

Aircraft batteries are typically designed to have large capacities, with the more advanced chemistries based on Lithium-ion that enable higher energy densities with even higher charge/discharge characteristics than existing battery types, such as Nickel-metal-hydride or Nickel-Cadmium. This more reactive chemistry can lead to electrolyte instabilities, especially at elevated temperatures. The battery state of charge (SOC) is usually determined by the battery cell voltage (CV) and battery cell temperature, and may not completely reveal the current battery health and relative stability of the battery cells. The objective of the present disclosure is to use reflectometry to measure the relative in-situ radio frequency (RF) impedance behavior of the cathode-anode assemblies within the battery cells, in conjunction with temperature, CV, and SOC assessments to obtain a more complete, integrated-over time assessment of battery health. The goal is to identify the risk of a battery cell failure or short.

SUMMARY

The present disclosure relates to a method, system, and apparatus for in-situ battery monitoring. The disclosed method for battery monitoring involves injecting at least one test signal into a battery. The method further involves receiving at least one response signal from the battery. In one or more embodiments, at least one response signal comprises at least one reflected signal. Also, the method involves comparing, with at least one processor, at least one response signal with at least one baseline signal to produce at least one comparison signal. In addition, the method involves detecting, with at least one processor, at least one anomaly within the battery by using at least one comparison signal. Further, the method involves determining, with at least one processor, the location of at least one anomaly within the battery by using at least one comparison signal.

In one or more embodiments, the battery comprises at least one battery cell and/or at least one battery case. In at least one embodiment, at least one test signal is injected into at least one anode of at least one battery cell, at least one cathode of at least one battery cell, and/or at least one battery case.

In at least one embodiment, at least one test signal is a radio frequency (RF) signal and/or a high frequency signal. In some embodiments, the method further involves generating, with at least one signal generator, at least one test signal.

In one or more embodiments, at least one test signal is coded with a code. In at least one embodiment, the code is a pseudorandom number code or a gold code. In some embodiments, at least one test signal is a spread-spectrum modulated signal. In one or more embodiments, the spread-spectrum signal is a chirped signal. In one or more embodiments, the method further involves decoding, with at least one decoder, at least one response signal.

In at least one embodiment, the injecting of at least one test signal into the battery is performed by at least one transmitter. In one or more embodiments, the receiving of at least one response signal from the battery is performed by at least one receiver. In some embodiments, at least one baseline signal is a function of an expected voltage for the battery, an expected temperature for the battery, and/or an expected impedance profile for the battery.

In one or more embodiments, a system for battery monitoring comprises at least one transmitter to inject at least one test signal into a battery. The system further comprises at least one receiver to receive at least one response signal from the battery. In at least one embodiment, at least one response signal comprises at least one reflected signal. Further, the system comprises at least one processor to compare at least one response signal with at least one baseline signal to produce at least one comparison signal, to detect at least one anomaly within the battery by using at least one comparison signal, and to determine a location of at least one anomaly within the battery by using at least one comparison signal.

In at least one embodiment, at least one transmitter is to inject at least one test signal into at least one anode of at least one battery cell, at least one cathode of at least one battery cell, and/or at least one battery case. In some embodiments, the system further comprises at least one signal generator to generate at least one test signal. In one or more embodiments, the system further comprises at least one decoder to decode at least one response signal.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

DESCRIPTION

The methods and apparatus disclosed herein provide an operative in-situ battery monitoring system. Specifically, the system injects high-frequency test signals into a battery and receives reflectometry-based response signals. The response signals comprise reflective signals, which have voltage levels that are in proportion to changes of the characteristic impedances of the conductive surfaces within the battery cell. If any of the voltage levels of the response signals exceeds the expected voltage levels of the response signals, this is an indication that the locations(s) of the reflection event(s) may be exhibiting an anomaly.

As previously mentioned above, aircraft batteries are typically designed to have large capacities, with the more advanced chemistries based on Lithium-ion that enable higher energy densities with even higher charge/discharge characteristics than existing battery types, such as Nickel-metal-hydride or Nickel-Cadmium. This more reactive chemistry can lead to electrolyte instabilities, especially at elevated temperatures. The battery state of charge (SOC) is usually determined by the battery cell voltage (CV) and may not completely reveal the current battery health and relative stability of the battery cells. The objective of the present disclosure is to use reflectometry to measure the relative in-situ radio frequency (RF) impedance behavior of the cathode-anode assemblies within the battery cells, in conjunction with temperature, CV, and SOC assessments to obtain a more complete, integrated-over time assessment of battery health. The goal is to identify the risk of a battery cell failure or short.

The integrated effects of electrical and environmental exposure to batteries can complicate the otherwise simple SOC assessment via CV measurements. In certain scenarios, the combined effects of manufacturing and environment can compromise the stability of a battery cell, thereby placing that battery cell and perhaps the other battery cells at risk for venting and/or fire. By monitoring the RF impedance of the cathode-anode assembly within a battery cell, the physical assembly position and integrity can be assessed, presumably by sensing dendrite growth and/or by detecting foreign object debris (FOD) that could trigger a short-circuit condition within a monitored battery cell.

Reflectometry-based measurements are currently the preferred method to determine distance-to-fault (DFT) on an electrical wire. Reflectometry methods inject radio or high-frequency tests signals on the wire-under-test (WUT). The signal voltage, from the test signals, reflects based in proportion to changes from the characteristic impedance of the WUT. If the measured reflection exceeds the expected reflection, additional scrutiny is required in the area of the reflection event. Electrically-conductive wires present themselves as "single-dimensional" with respect to radio or high-frequency electromagnetic wave transmission behavior, as there is circular symmetry about the wire and the insulating dielectric materials. For electrically-conductive plates, as one would find in a battery cell, referred to as a cathode-anode structure, such high-frequency waves transmission becomes more complex as the wave fronts reflect off from the edges of this two-dimensional structure. While the reflectometry assessment is more complex for this structure, the characteristic impedance is predominately determined by the physical spacing and surrounding electrolyte chemistry, thereby implying that the reflectometry assessment of such a battery structure is feasible. The objective is not to detect DFT, but rather to detect a shorting condition resulting from either a singular location (i.e. a dendrite) or other structural issue driving a gap closure between the cathode and the anode. In the event of an increased gap between the cathode and anode due to separation, we would expect to detect an open condition. By continuously assessing the radio or high-frequency impedance of the cathode-anode assembly, the changes in impedance response becomes a key metric.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Figure 1:
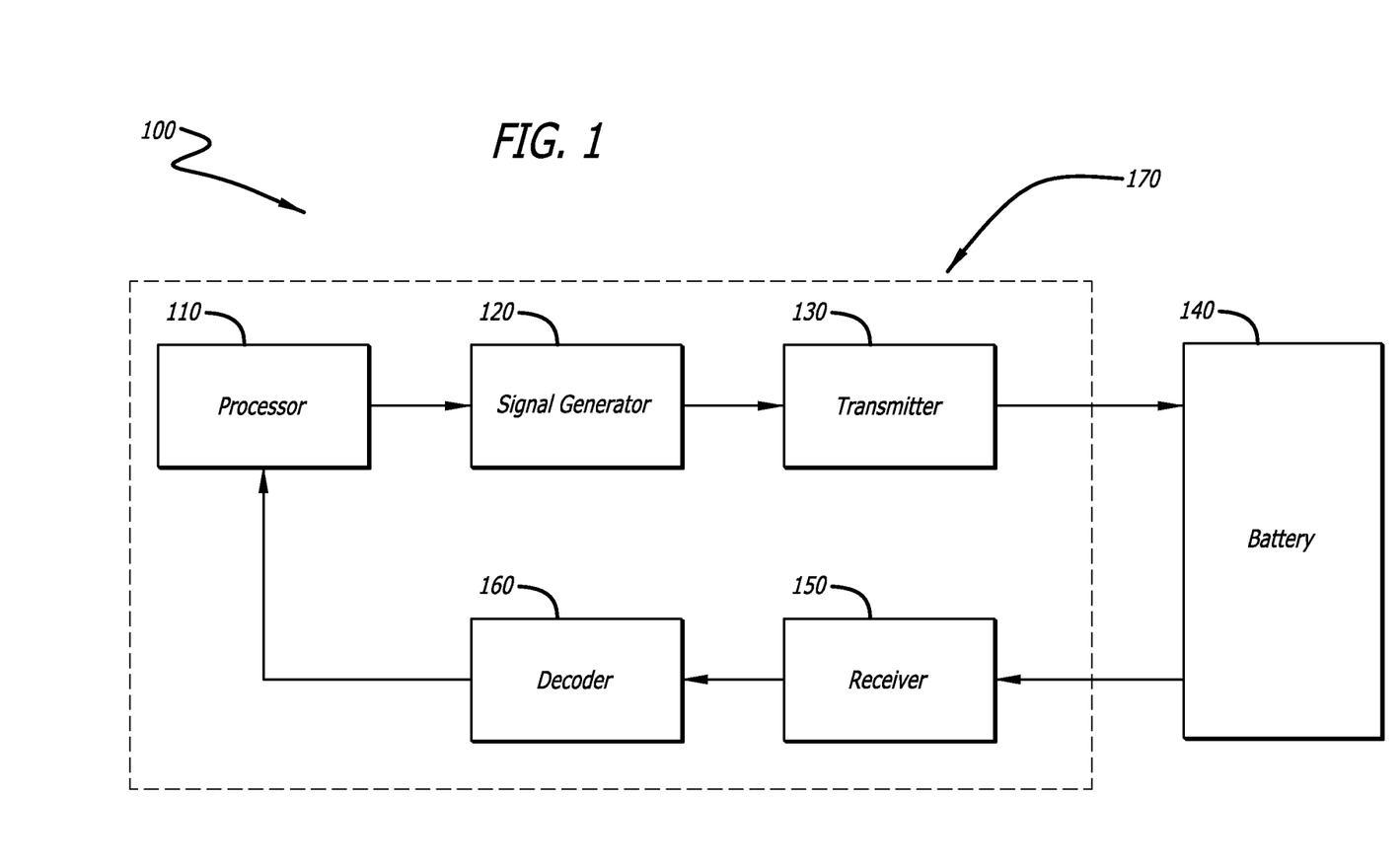
FIG. 1 is a schematic diagram of the disclosed system for battery monitoring, in accordance with at least one embodiment of the present disclosure.

FIG. 1 is a schematic diagram of the disclosed system 100 for battery monitoring, in accordance with at least one embodiment of the present disclosure. In this figure, monitoring electronics 170 is shown to be injecting a test signal into a battery 140. The test signal, in one or more embodiments, is a radio- or high-frequency signal (e.g., 1 to 300 megahertz (MHz), or 300 MHz to 10 gigahertz (GHz)). The battery 140 comprises at least one battery cell (not shown) and/or at least one battery case (not shown).

Figure 9:
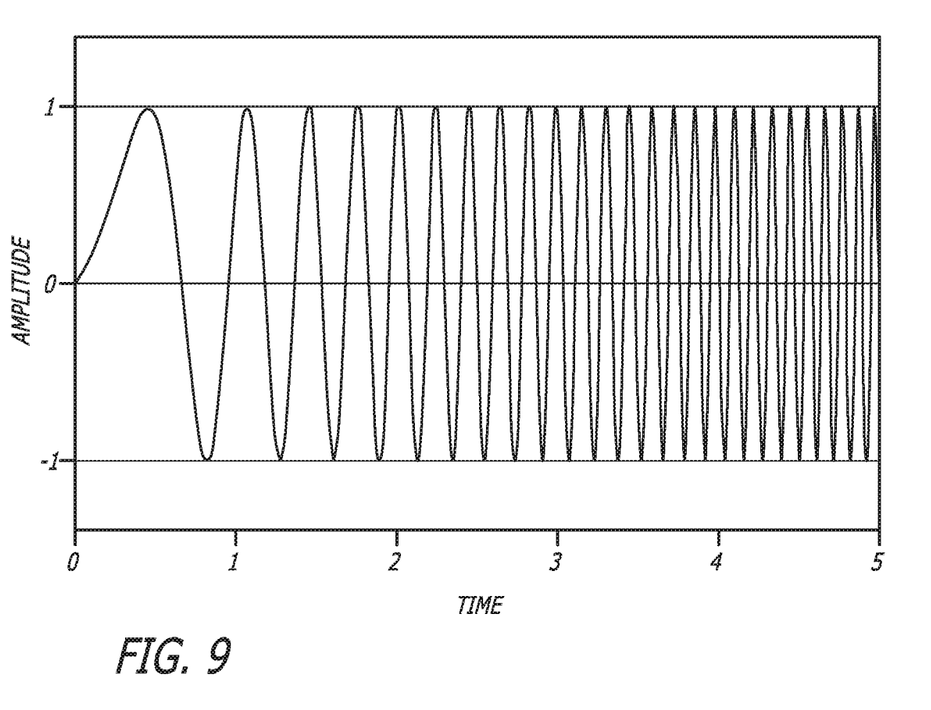
FIG. 9 is a graph illustrating an exemplary chirped signal, in accordance with at least one embodiment of the present disclosure.

During operation of the system 100, a processor 110 in the monitoring electronics 170 first determines the type of test signal to be injected into the battery 140. The processor 110 then sends instructions to a signal generator 120 to generate the test signal. In one or more embodiments, the test signal is coded with a code, such as a pseudorandom number code or a gold code. For these embodiments, the signal generator 120 implements the processor's 110 instructions regarding the code into the test signal at the appropriate frequencies. In some embodiments, the test signal is a spread-spectrum modulated signal. In other embodiments, the test signal is a chirped signal. A chirped signal is a signal in which the frequency increases (up-chirp) or decreases (down-chirp) with time. FIG. 9 shows an exemplary linear chirp waveform comprising a sinusoidal wave that increases in frequency linearly over time.

After the signal generator 120 generates the test signal, the test signal is injected by a transmitter 130 into the battery 140. The test signal is injected into at least one anode of at least one battery cell (not shown), at least one cathode of at least one battery cell (not shown), and/or at least one battery case (not shown). A detailed discussion regarding the different injection configurations for the battery 140 is discussed in the description of FIGS. 3A, 3B, and 3C.

Once a test signal is injected into the battery 140, a response signal is received from a receiver 150. The response signal comprises at least one reflected signal. The response signal will help to indicate specific possible anomalies in the battery 140. One possible anomaly in the battery 140 is an open circuit. For an open circuit anomaly, the response signal will contain a reflected signal(s) with a higher voltage level due to a larger reflection off the open circuit. Another possible anomaly in the battery 140 is a dendrite. For a dendrite anomaly or a conductive foreign object(s) not bridging the cathode-anode sub-assembly, the response signal will contain a reflected signal(s) with a slightly lower voltage due to a smaller reflection off the local area of this anomaly. And, another possible anomaly in the battery is a short circuit. For a short circuit anomaly, the response signal will contain a reflected signal(s) with a substantially lower voltage due to the absorption of the transmitted signal into the local area of this anomaly. In all three anomalies cited, the reflectometry signal incurs a time delay based on the time from the transmitter 130 to the anomaly plus the time for the reflected signal to return the receiver 150.

After the response signal is received by the receiver 150, a decoder 160 decodes the response signal. Then, the processor 110 compares the response signal with a baseline signal to produce a comparison signal. For this comparison, the processor 110 specifically compares of the code of the response signal with the code of the baseline signal to produce a code for the comparison signal. In one or more embodiments, the baseline signal is a function of the expected voltage of the battery 140, the expected temperature of the battery 140, and/or the expected impedance profile for the battery 140.

Then, the processor 110 uses the comparison signal to detect (and identify) at least one anomaly within the battery 140. In addition, the processor 110 uses the comparison signal to determine the location of the anomaly in the battery 140.

It should be noted that in one or more embodiments, the processor 110 of the monitoring electronics 170 may be in communication (e.g., either by wire or wirelessly) with a display, which is used to display the signals (e.g., the response signal, the baseline signal, and/or the comparison signal). The display may be a computer display unit that is part of, for example, a desktop computer (similar to server 704 in FIG. 7) or a laptop computer (similar to client 710 in FIG. 7).

Figure 2:
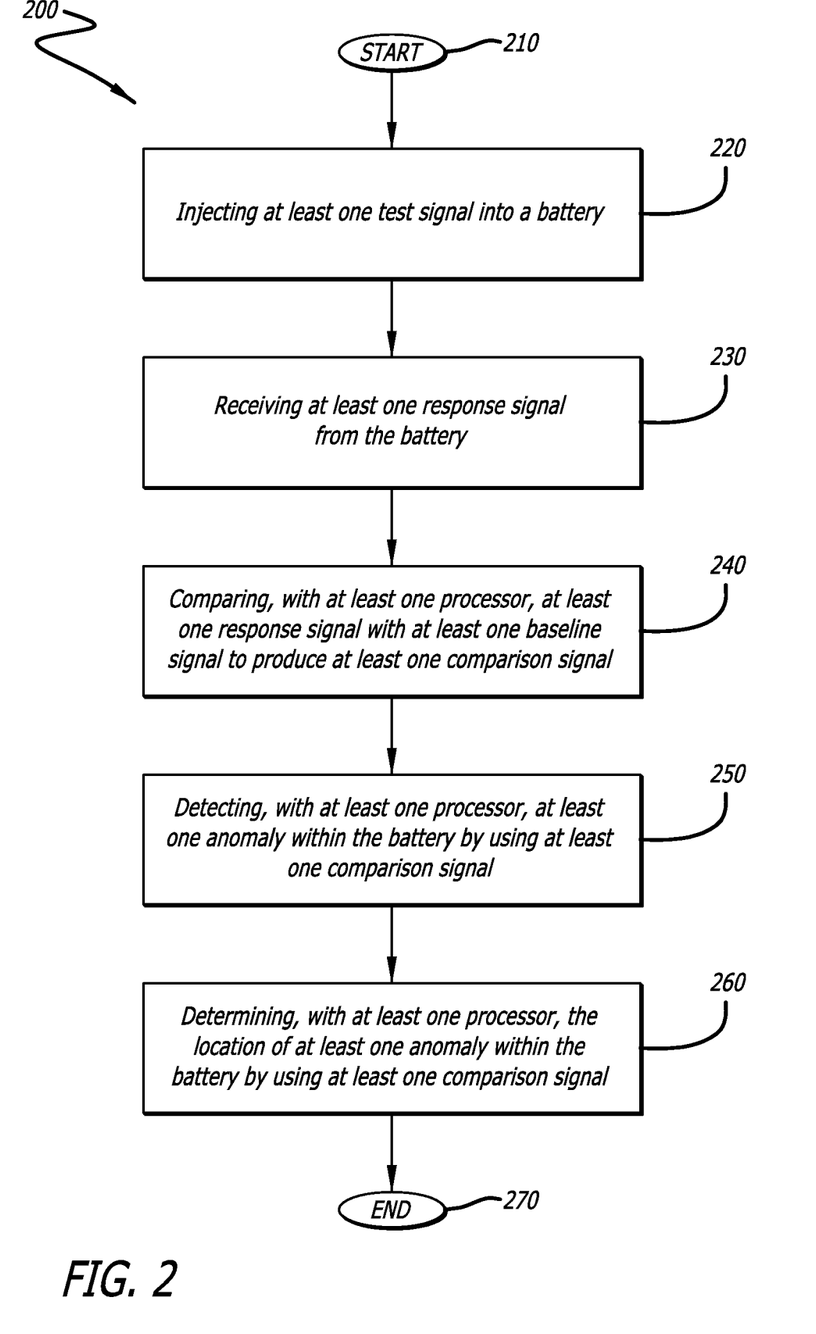
FIG. 2 is a flow chart for the disclosed method for battery monitoring, in accordance with at least one embodiment of the present disclosure.

FIG. 2 is a flow chart for the disclosed method 200 for battery monitoring, in accordance with at least one embodiment of the present disclosure. At the start 210 of the method 200, at least one test signal is injected into a battery 220. Then, at least one response signal from the battery is received 230. After the response signal(s) is received, at least one processor compares the response signal(s) with at least one baseline signal to produce at least one comparison signal 240. Then, at least one processor detects at least one anomaly within the battery by using the comparison signal(s) 250. Also, at least one processor determines the location of at least one anomaly within the battery by using the comparison signal(s) 260. Then, the method 200 ends 270.

Figure 3A:
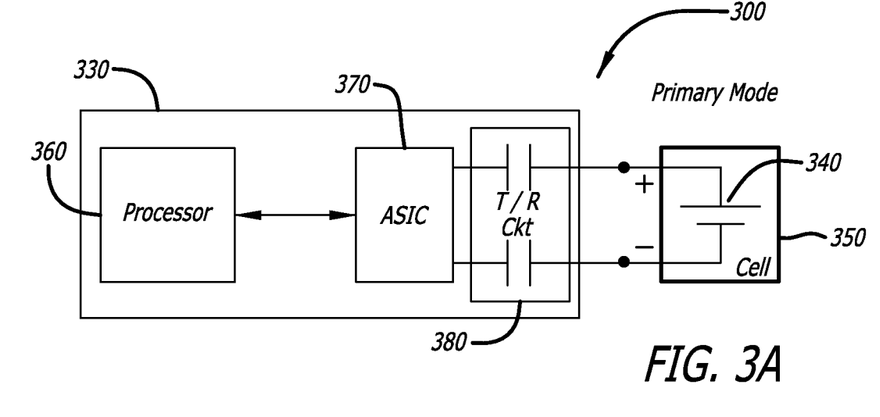
FIG. 3A is a schematic diagram showing a primary (cathode to anode referenced) configuration for the disclosed battery monitoring system, in accordance with at least one embodiment of the present disclosure.

FIG. 3A is a schematic diagram 300 showing the primary (cathode to anode referenced) configuration for the disclosed battery monitoring system, in accordance with at least one embodiment of the present disclosure. In this figure, monitoring electronics 330 is shown to be injecting a test signal into a battery cell 340 encompassed by a battery case 350.

During operation of the system, a processor 360 in the monitoring electronics 330 determines the type of test signal to be injected into the battery 340. The processor 360 then sends instructions to an application specific integrated circuit (ASIC) 370 to generate the test signal. The test signal may be coded with a code, such as a pseudorandom number code or a gold code. For these embodiments, the ASIC 370 implements the processor's 360 instructions regarding the code into the test signal at the appropriate frequencies. In some embodiments, the test signal may be a spread-spectrum modulated signal, or in other embodiments, the test signal is a chirped signal.

After the ASIC 370 generates the test signal, the test signal is injected by a transmitter of a transmitter/receiver circuit (T/R Ckt) 380 into the battery 340. For this primary configuration, the test signal is shown to be injected into the cathode (denoted by a plus sign) of the battery cell 340, and referenced through the anode (denoted by a minus sign) of the battery cell 340. It should be noted that, in one or more embodiments, the transmitter/receiver circuit 380 comprises capacitors, as is shown in the figure.

Once the test signal travels into the battery cell 340, a response signal is referenced from the anode of the battery cell 340. A receiver of the transmitter/receiver circuit 380 receives the response signal. The response signal comprises at least one reflected signal.

After the response signal is received by the receiver, the ASIC 370 decodes the response signal. Then, the processor 360 compares the response signal with a baseline signal to produce a comparison signal. The processor 360 then uses the comparison signal to detect (and identify) at least one anomaly within the battery cell 340. In addition, the processor 360 uses the comparison signal to determine the location of the anomaly in the battery cell 340.

Figure 3B:
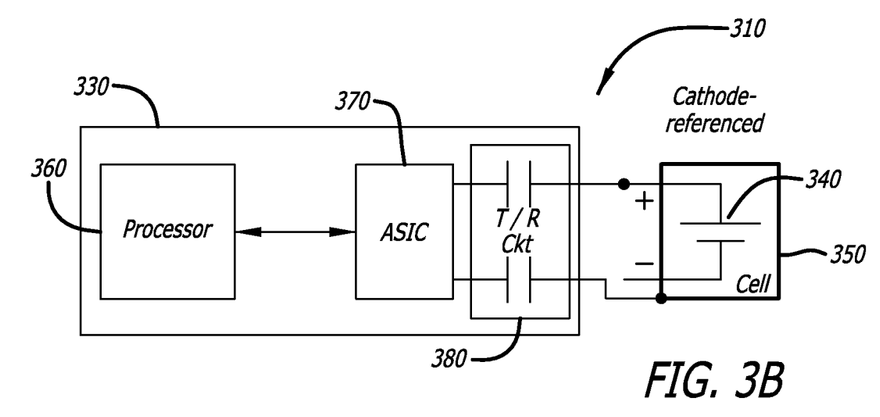
FIG. 3B is a schematic diagram showing a cathode to case referenced configuration for the disclosed battery monitoring system, in accordance with at least one embodiment of the present disclosure.

FIG. 3B is a schematic diagram 310 showing a cathode to case referenced configuration for the disclosed battery monitoring system, in accordance with at least one embodiment of the present disclosure. This figure is the same as FIG. 3A except that this figure shows a different configuration for the injection of the test signal. For this configuration, the test signal is shown to be injected into the cathode of the battery cell 340, and is referenced from the battery case 350. It should be noted that this configuration requires that the battery case 350 be electrically conductive.

Figure 3C:
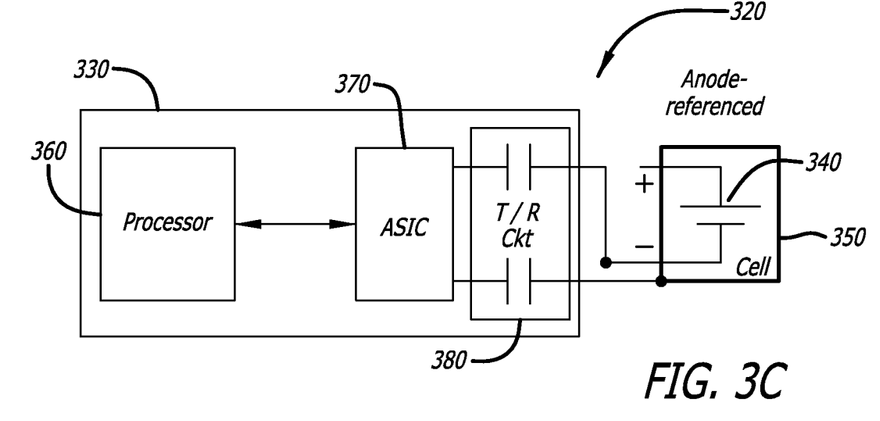
FIG. 3C is a schematic diagram showing an anode to case referenced configuration for the disclosed battery monitoring system, in accordance with at least one embodiment of the present disclosure.

FIG. 3C is a schematic diagram 320 showing an anode to case referenced configuration for the disclosed battery monitoring system, in accordance with at least one embodiment of the present disclosure. This figure is the same as FIGS. 3A and 3B except that this figure shows a different configuration for the injection of the test signal. For this configuration, the test signal is shown to be injected into the anode of the battery cell 340, and is referenced from the battery case 350. It should be noted that this configuration requires that the battery case 350 be electrically conductive.

Figure 4A:
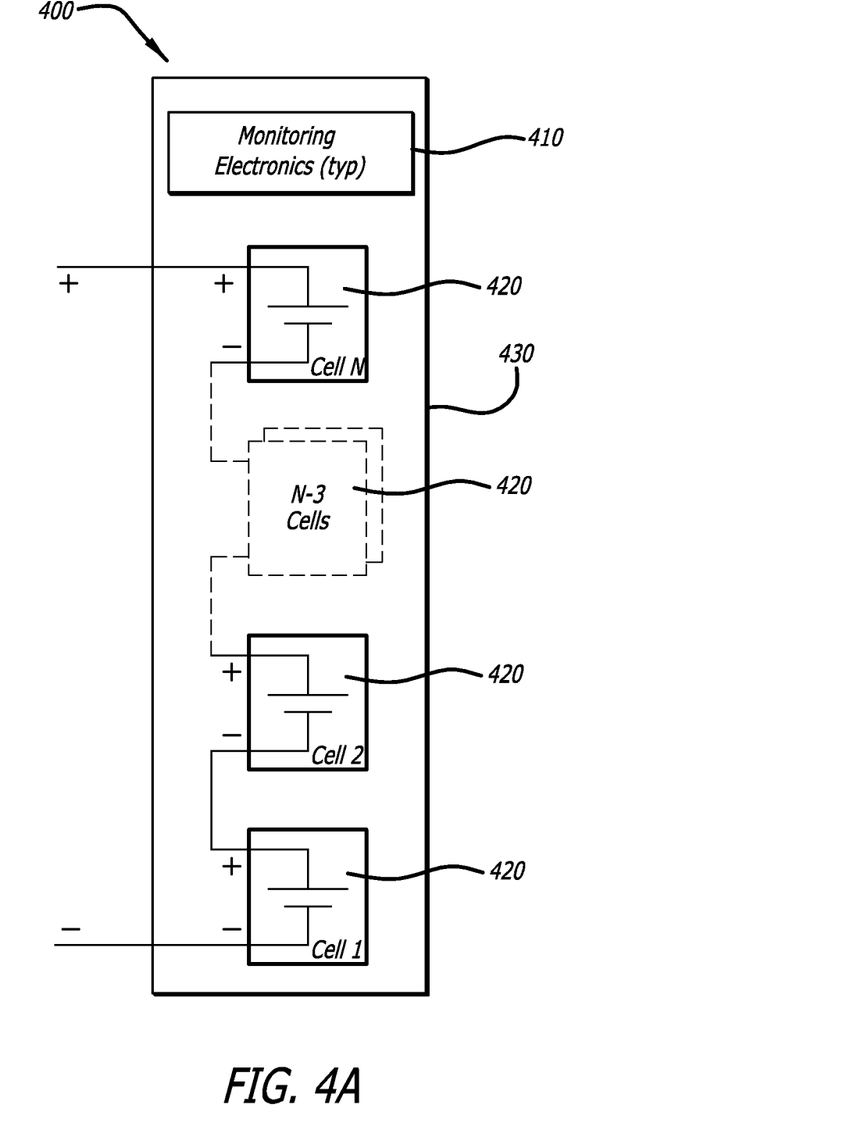
FIG. 4A is a schematic diagram showing a monitoring configuration for a plurality of battery cells for the disclosed battery monitoring system where the battery cells are connected in series, in accordance with at least one embodiment of the present disclosure.

FIG. 4A is a schematic diagram 400 showing a monitoring configuration for a plurality of battery cells 420 for the disclosed battery monitoring system where the battery cells are connected in series, in accordance with at least one embodiment of the present disclosure. In this figure, monitoring electronics 410 are injecting a test signal into a plurality of battery cells 420, which are housed along with the monitoring electronics 410 in a battery case 430. The plurality of battery cells 420 in this figure are connected together in series. The operation of the monitoring electronics 410 is the same as described in FIG. 3A.

Figure 4B:
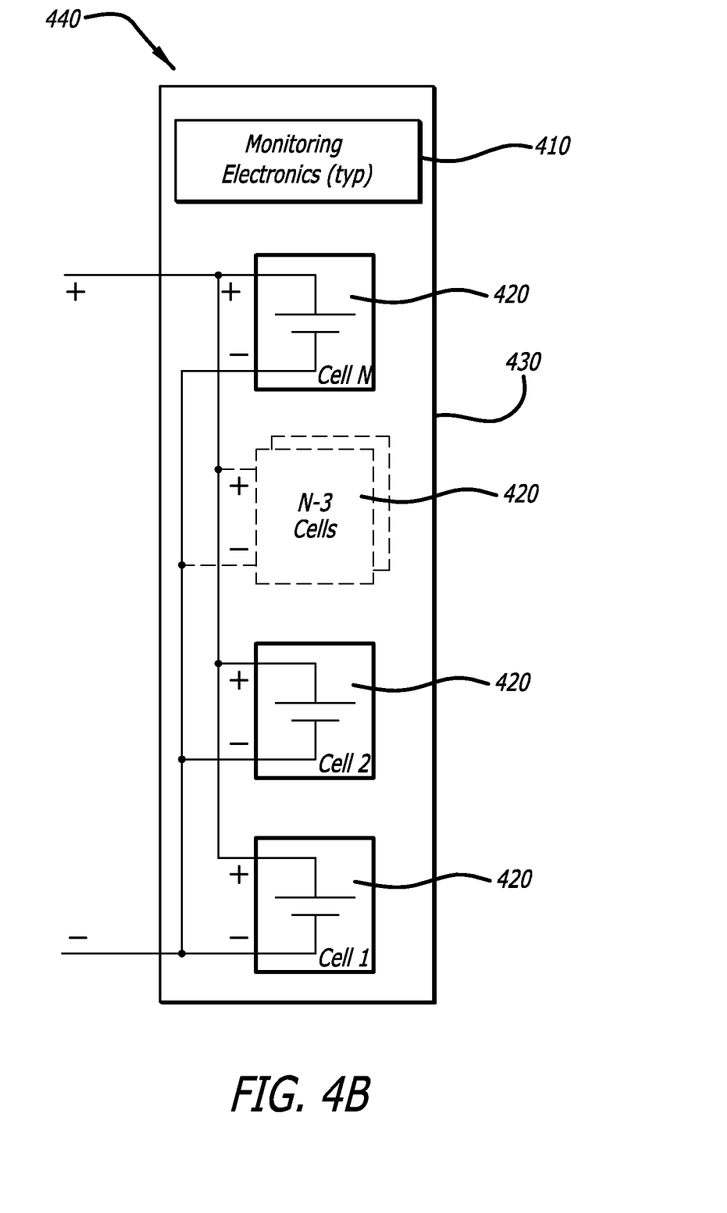
FIG. 4B is a schematic diagram showing a monitoring configuration for a plurality of battery cells for the disclosed battery monitoring system where the battery cells are connected in parallel, in accordance with at least one embodiment of the present disclosure.

FIG. 4B is a schematic diagram 440 showing a monitoring configuration for a plurality of battery cells 420 for the disclosed battery monitoring system where the battery cells are connected in parallel, in accordance with at least one embodiment of the present disclosure. The monitoring configuration depicted in FIG. 4B is the same as the monitoring configuration shown in FIG. 4A except that the battery cells 420 are connected in parallel, instead of in series, as is shown in FIG. 4A.

It should be noted that in other embodiments, various different monitoring configurations may be used for the disclosed battery monitoring system than the monitoring configurations shown in FIGS. 4A and 4B. For example, in some embodiments, the battery cells 420 may be connected together by a combination of series and parallel connections. Also, it should be noted that during testing, not all of the battery cells 420 need to be tested each time. For these cases, only one or some of the battery cells 420 may be tested each time.

Figure 5:
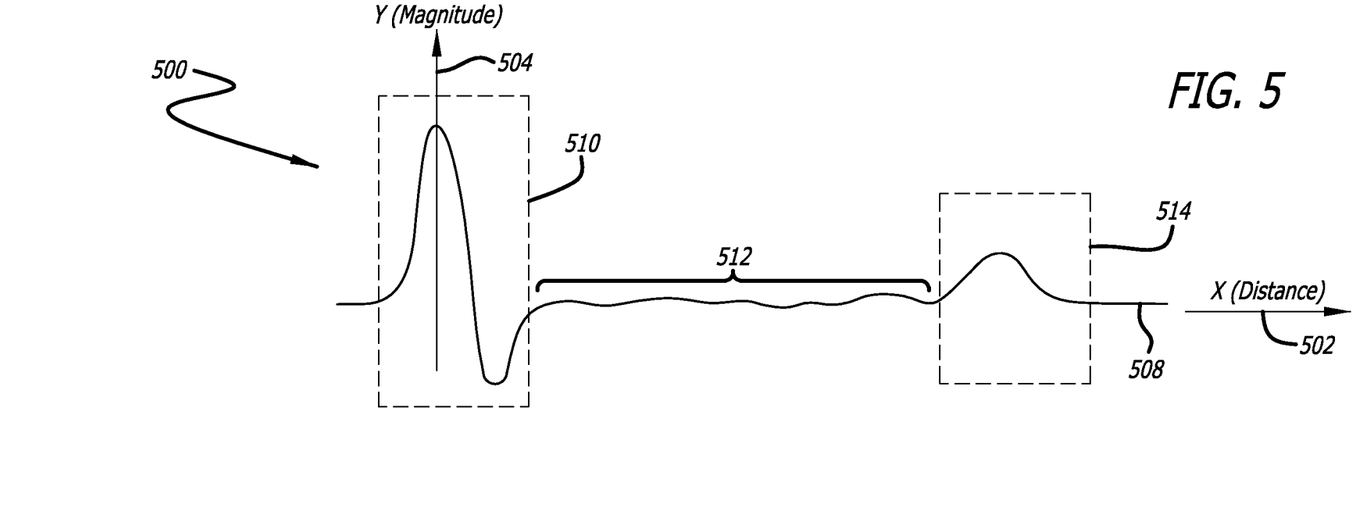
FIG. 5 is a graph illustrating an exemplary baseline signal, in accordance with at least one embodiment of the present disclosure.

FIG. 5 is a graph 500 illustrating an exemplary baseline signal 508, in accordance with at least one embodiment of the present disclosure. Graph 500 has a horizontal axis and a vertical axis. In this example, the horizontal access is a distance axis 502. Distance axis 502 represents the distance away from the location of the battery cell (or the battery case) from which the test signal was injected. Points on graph 500 closer to the intersection point between distance axis 502 and the vertical axis represent a shorter distance from the physical location at which the test signal was injected. Likewise, points on graph 500 farther from the intersection point between distance axis 502 and the vertical axis represent a longer distance from the physical location at which the test signal was injected.

The vertical axis is the signal voltage axis 504. Signal voltage axis 504 represents the strength of the baseline signal 508. The strength of the baseline signal 508 may correspond to an impedance change encountered by the test signal at a given location in the battery cell or the battery case. Points on graph 500 closer to the intersection between signal voltage axis 504 and distance axis 502 indicate a lower voltage, while points on graph 500 farther from the intersection between signal voltage axis 504 and distance axis 502 indicate a greater voltage.

It should be noted that portion 510 (i.e. a high voltage spike) of the baseline signal 508 shows a typical impedance mismatch at the test signal injection point. The test signal injection point represents the location at which the test signal enters (or is injected) into the battery cell or the battery case. Section 512 of the baseline signal 508 illustrates a region of the reflection signature showing the RF impedance behavior of the cathode-anode structure of the battery. Also, portion 514 of the baseline signal 508 shows the impedance mismatch at the end of the cathode of the battery.

Figure 6:
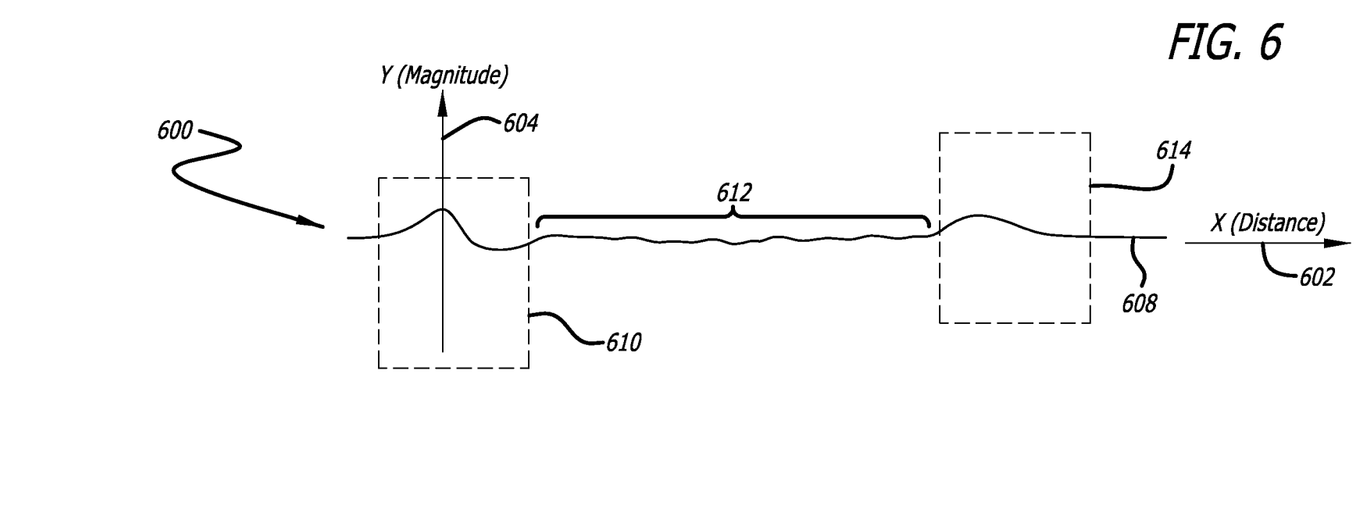
FIG. 6 is a graph showing an exemplary comparison signal, in accordance with at least one embodiment of the present disclosure.

FIG. 6 is a graph 600 showing an exemplary comparison signal 608, in accordance with at least one embodiment of the present disclosure. Graph 600 has a horizontal axis and a vertical axis. In this example, the horizontal access is a distance axis 602. Distance axis 602 represents the distance away from the location of the battery cell (or the battery case) from which the test signal was injected. Points on graph 600 closer to the intersection point between distance axis 602 and the vertical axis represent a shorter distance from the physical location at which the test signal was injected. Likewise, points on graph 600 farther from the intersection point between distance axis 602 and the vertical axis represent a longer distance from the physical location at which the test signal was injected.

The vertical axis is the signal voltage axis 604. Signal voltage axis 604 represents the magnitude of the comparison signal 608. The magnitude of the comparison signal 608 corresponds to the magnitude of the difference of an impedance change encountered by the test signal at a given location in the battery cell or the battery case. Points on graph 600 closer to the intersection between signal voltage axis 604 and distance axis 602 indicate a lower magnitude (i.e. voltage), while points on graph 600 farther from the intersection between signal voltage axis 604 and distance axis 602 indicate a greater magnitude (i.e. voltage).

The comparison signal 608 on graph 600 is an example of the difference between the baseline signal 508 and the first sample signal measurement that is taken (not shown). The comparison signal 608 is to be used to detect the change in the differences from the baseline signal 508 of graph 500 of FIG. 5. During the operation of the disclosed system, multiple response signals (i.e. multiple sample signal measurements) are taken over time to be compared with the baseline signal 508. By comparing multiple response signals with the baseline signal 508 over time, a gradual change in the difference in the signals (i.e. the difference between the baseline signal 508 and the response signals) can indicate at least one anomaly in the battery.

In FIG. 6, portion 610 (i.e. a small voltage difference) of the comparison signal 608 shows a typical allowable difference of the impedance mismatch at the test signal injection point. The test signal injection point represents the location at which the test signal enters (or is injected) into the battery cell or the battery case. Section 612 of the comparison signal 608 illustrates a region of interest that is monitored for trends of RF impedance changes over time. Trends, for example, of the signal lying below the distance axis (x-axis) 602 suggest shorting trends in the battery. And, trends, for example, of the signal lying above the signal voltage axis (y-axis) 604 suggest open circuit trends in the battery. In addition, portion 614 of the comparison signal 608 shows a typical allowable difference of the impedance mismatch at the end of the cathode of the battery.

Figure 7:
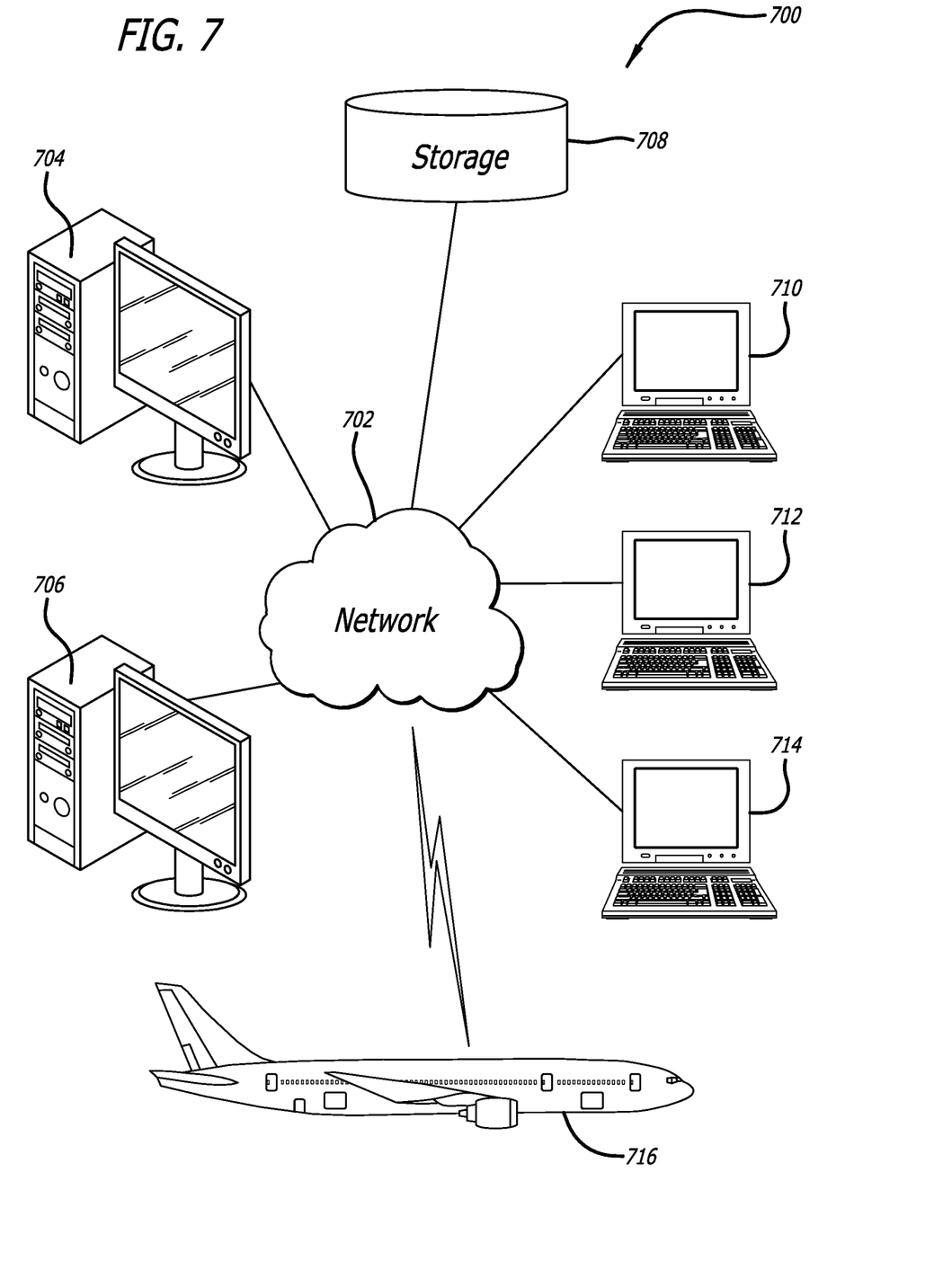
FIG. 7 is a schematic diagram of a network of data processing systems that may be employed by the disclosed battery monitoring system, in accordance with at least one embodiment of the present disclosure.
Figure 8:
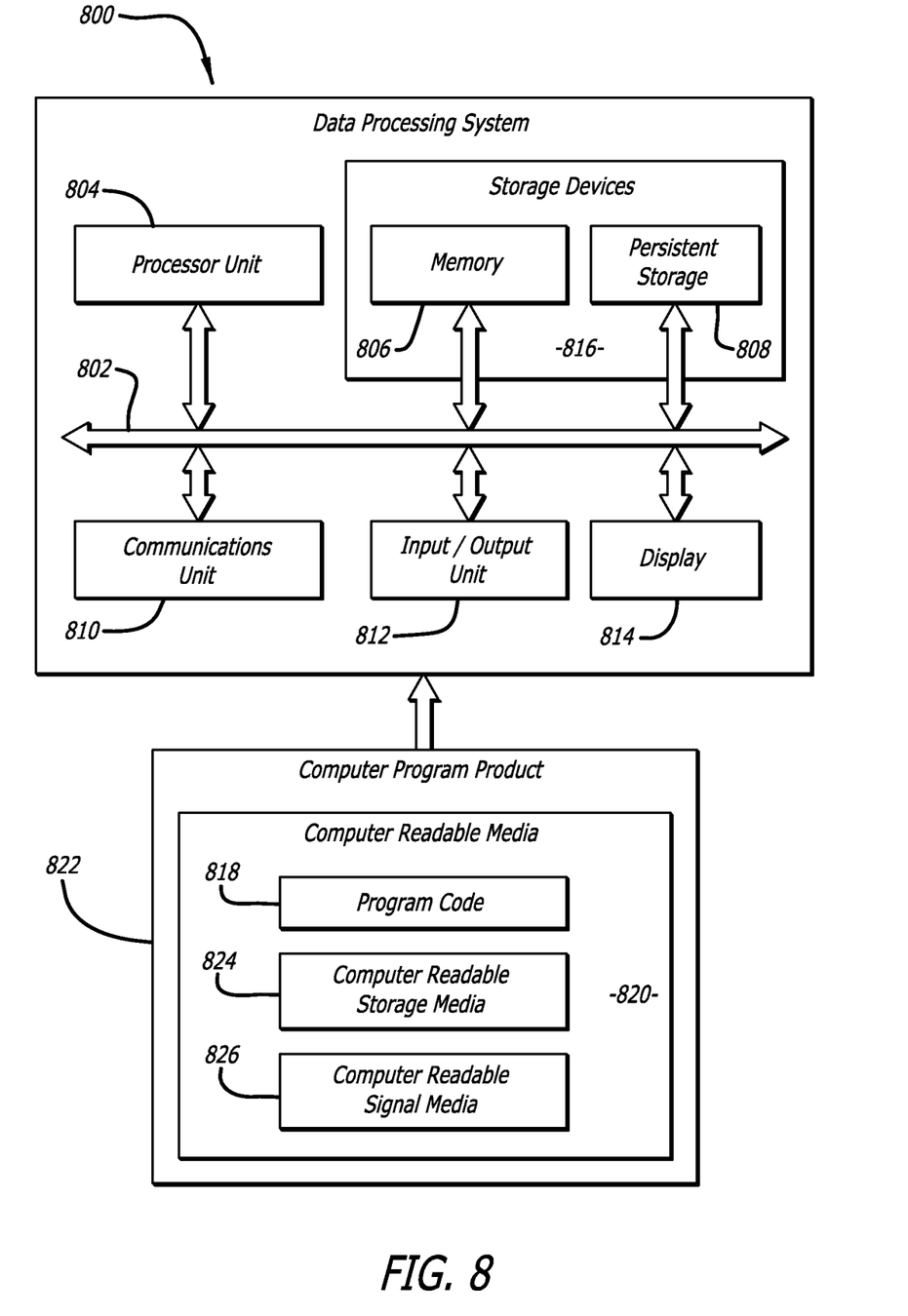
FIG. 8 is a schematic diagram of a data processing system that may be employed by the disclosed battery monitoring system, in accordance with at least one embodiment of the present disclosure.

With reference now to FIGS. 7 and 8, exemplary diagrams of data processing environments are provided in which embodiments of the present disclosure may be implemented. It should be appreciated that FIGS. 7 and 8 are only exemplary and are not intended to assert or imply any limitation with regard to the environments in which different embodiments may be implemented. Many modifications to the depicted environments may be made.

FIG. 7 is a schematic diagram of a network of data processing systems that may be employed by the disclosed battery monitoring system, in accordance with at least one embodiment of the present disclosure. Network data processing system 700 is a network of computers in which embodiments of the disclosed battery monitoring system may be implemented. Network data processing system 700 may be used to monitor for anomalies in the battery (e.g., a battery comprising at least one battery cell and/or at least one battery case) of, for example, an aircraft. Monitoring may be performed in any suitable aircraft manufacturing and service method. For example, monitoring for anomalies in a battery of an aircraft may be performed during component and subassembly manufacturing, in service, and/or maintenance and service. Network data processing system 700 contains network 702, which is the medium used to provide communications links between various devices and computers connected together within network data processing system 700. Network 702 may include connections, such as wire, wireless communication links, or fiber optic cables.

In the depicted example, server 704 and server 706 connect to network 702 along with storage unit 708. In addition, clients 710, 712, and 714 connect to network 702. These clients 710, 712, and 714 may be, for example, personal computers or network computers. In the depicted example, server 704 provides data, such as boot files, operating system images, and applications to clients 710, 712, and 714. Clients 710, 712, and 714 are clients to server 704 in this example. Aircraft 716 also is a client that may exchange information with clients 710, 712, and 714. Aircraft 716 also may exchange information with servers 704 and 706. Aircraft 716 may exchange data with different computers through a wireless communications link while in-flight or any other type of communications link while on the ground. In these examples, server 704, server 706, client 710, client 712, and client 714 may be computers. Network data processing system 700 may include additional servers, clients, and other devices not shown. It should be noted that in other embodiments, aircraft 716 may be other types of vehicles or platforms that employ any type of sophisticated battery (i.e. a battery that has a high level of amp-hours and a high energy density chemistry) that tends to require maintenance and monitoring for degradation.

In one advantageous embodiment, client 710 is used as a monitoring unit to inject test signals and receive response signals through a battery in aircraft 716. Server 706 may then be used to compare the response signals with baselines signals to produce comparison signals, which are used to determine if any anomalies are present in the battery. Of course, it will be appreciated that aircraft 716, client 710 and/or server 706 may contain parts of or the entirety of the monitoring unit.

Aircraft 716 may also have a monitoring unit located onboard aircraft 716. Aircraft 716 may transmit a response signal, a baseline signal, and/or a comparison signal to client 710 and/or server 706, for example. Client 710 and/or server 706 may be located at a facility of the manufacturer of aircraft 716, an airline, or any other suitable location. Additionally, client 710 and/or server 706 may transmit and receive one or more requests and responses to aircraft 716 using network 702. The requests may be requests to monitor the battery onboard aircraft 716. The responses may be one or more response signals from the battery and/or alerts regarding the status of the battery health.

In the depicted example, network data processing system 700 is the Internet with network 702 representing a worldwide collection of networks and gateways that use the Transmission Control Protocol/Internet Protocol (TCP/IP) suite of protocols to communicate with one another. Of course, network data processing system 700 also may be implemented as a number of different types of networks, such as for example, an intranet, a local area network (LAN), or a wide area network (WAN). FIG. 7 is intended as an example, and not as an architectural limitation for different embodiments.

FIG. 8 is a schematic diagram of a data processing system 800 that may be employed by the disclosed battery monitoring system, in accordance with at least one embodiment of the present disclosure. Data processing system 800 is an example of a data processing system that may be used to implement servers and clients, such as server 704 and client 710. Further, data processing system 800 is an example of a data processing system that may be found in aircraft 716 in FIG. 7.

In this illustrative example, data processing system 800 includes communications fabric 802, which provides communications between processor unit 804, memory 806, persistent storage 808, communications unit 810, input/output (I/O) unit 812, and display 814.

Processor unit 804 serves to execute instructions for software that may be loaded into memory 806. Processor unit 804 may be a number of one or more processors or may be a multi-processor core, depending on the particular implementation. Further, processor unit 804 may be implemented using one or more heterogeneous processor systems, in which a main processor is present with secondary processors on a single chip. As another illustrative example, processor unit 804 may be a symmetric multi-processor system containing multiple processors of the same type.

Memory 806 and persistent storage 808 are examples of storage devices 816. A storage device is any piece of hardware that is capable of storing information, such as, for example, without limitation, data, program code in functional form, and/or other suitable information either on a temporary basis and/or a permanent basis. Memory 806, in these examples, may be, for example, a random access memory, or any other suitable volatile or non-volatile storage device. Persistent storage 808 may take various forms, depending on the particular implementation. For example, persistent storage 808 may contain one or more components or devices. For example, persistent storage 808 may be a hard drive, a flash memory, a rewritable optical disk, a rewritable magnetic tape, or some combination of the above. The media used by persistent storage 808 may be removable. For example, a removable hard drive may be used for persistent storage 808.

Communications unit 810, in these examples, provides for communication with other data processing systems or devices. In these examples, communications unit 810 is a network interface card. Communications unit 810 may provide communications through the use of either or both physical and wireless communications links.

Input/output unit 812 allows for the input and output of data with other devices that may be connected to data processing system 800. For example, input/output unit 812 may provide a connection for user input through a keyboard, a mouse, and/or some other suitable input device. Further, input/output unit 812 may send output to a printer. Display 814 provides a mechanism to display information to a user.

Instructions for the operating system, applications, and/or programs may be located in storage devices 816, which are in communication with processor unit 804 through communications fabric 802. In these illustrative examples, the instructions are in a functional form on persistent storage 808. These instructions may be loaded into memory 806 for execution by processor unit 804. The processes of the different embodiments may be performed by processor unit 804 using computer implemented instructions, which may be located in a memory, such as memory 806.

These instructions are referred to as program code, computer usable program code, or computer readable program code that may be read and executed by a processor in processor unit 804. The program code, in the different embodiments, may be embodied on different physical or computer readable storage media, such as memory 806 or persistent storage 808.

Program code 818 is located in a functional form on computer readable media 820 that is selectively removable and may be loaded onto or transferred to data processing system 800 for execution by processor unit 804. Program code 818 and computer readable media 820 form computer program product 822. In one example, computer readable media 820 may be computer readable storage media 824 or computer readable signal media 826. Computer readable storage media 824 may include, for example, an optical or magnetic disc that is inserted or placed into a drive or other device that is part of persistent storage 808 for transfer onto a storage device, such as a hard drive, that is part of persistent storage 808. Computer readable storage media 824 also may take the form of a persistent storage, such as a hard drive, a thumb drive, or a flash memory that is connected to data processing system 800. In some instances, computer readable storage media 824 may not be removable from data processing system 800.

Alternatively, program code 818 may be transferred to data processing system 800 using computer readable signal media 826. Computer readable signal media 826 may be, for example, a propagated data signal containing program code 818. For example, computer readable signal media 826 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communications links or wireless transmissions containing the program code.

In some illustrative embodiments, program code 818 may be downloaded over a network to persistent storage 808 from another device or data processing system through computer readable signal media 826 for use within data processing system 800. For instance, program code stored in a computer readable storage media in a server data processing system may be downloaded over a network from the server to data processing system 800. The data processing system providing program code 818 may be a server computer, a client computer, or some other device capable of storing and transmitting program code 818.

The different components illustrated for data processing system 800 are not meant to provide architectural limitations to the manner in which different embodiments may be implemented. The different illustrative embodiments may be implemented in a data processing system including components in addition to or in place of those illustrated for data processing system 800. Other components shown in FIG. 8 can be varied from the illustrative examples shown. The different embodiments may be implemented using any hardware device or system capable of executing program code. As one example, data processing system 800 may include organic components integrated with inorganic components and/or may be comprised entirely of organic components excluding a human being. For example, a storage device may be comprised of an organic semiconductor.

As another example, a storage device in data processing system 800 is any hardware apparatus that may store data. Memory 806, persistent storage 808, and computer readable media 820 are examples of storage devices in a tangible form.

In another example, a bus system may be used to implement communications fabric 802 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 806 or a cache such as found in an interface and memory controller hub that may be present in communications fabric 802.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for battery monitoring, the method comprising:
    injecting a test signal into a battery, wherein the test signal is a radio frequency (RF) signal;
    receiving, in response to the test signal, a response signal from the battery;
    comparing, with a processor, the response signal with a baseline signal to produce a comparison signal;
    detecting, with the processor, an anomaly within the battery by using the comparison signal; and
    determining, with the processor, a location of the anomaly within the battery by using the comparison signal;
    wherein the anomaly is at least one of an open circuit, a dendrite growth, a short circuit, or foreign object debris (FOD).

2. The method of claim 1, wherein the battery comprises at least one of a battery cell or a battery case.

3. The method of claim 2, wherein the test signal is injected into at least one of an anode of the battery cell, a cathode of the battery cell, or the battery case.

4. The method of claim 1, wherein the method further comprises generating, with a signal generator, the test signal.

5. The method of claim 1, wherein the test signal is coded with a code.

6. The method of claim 5, wherein the code is one of a pseudorandom number code or a gold code.

7. The method of claim 5, wherein the test signal is a spread-spectrum modulated signal.

8. The method of claim 7, wherein the spread-spectrum signal is a chirped signal.

9. The method of claim 5, wherein the method further comprises decoding, with a decoder, the response signal.

10. The method of claim 1, wherein the injecting of the test signal into the battery is performed by a transmitter.

11. The method of claim 1, wherein the receiving of the response signal from the battery is performed by a receiver.

12. The method of claim 1, wherein the baseline signal is a function of at least one of an expected voltage for the battery, an expected temperature for the battery, or an expected impedance profile for the battery.

13. The method of claim 5, wherein the method further comprises, prior to performing the comparing, decoding the response signal to generate a code of the response signal.

14. The method of claim 13, wherein the comparing comprises comparing the code of the response signal with a code of the baseline signal to produce a code for the comparison signal.

15. A system for battery monitoring, the system comprising:
    a transmitter configured to inject a test signal into a battery, wherein the test signal is a radio frequency (RF) signal;
    a receiver configured to receive a response signal from the battery; and
    a processor configured to:
        compare the response signal with a baseline signal to produce a comparison signal;
        detect an anomaly within the battery by using the comparison signal; and
        determine a location of the anomaly within the battery by using the comparison signal;

wherein the anomaly is at least one of an open circuit, a dendrite growth, a short circuit, or foreign object debris (FOD).

16. The system of claim 15, wherein the battery comprises at least one of a battery cell or a battery case.

17. The system of claim 16, wherein the transmitter is configured to inject the test signal into at least one of an anode of the battery cell, a cathode of the battery cell, or the battery case.

18. The system of claim 15, wherein the system further comprises a signal generator configured to generate the test signal.

19. The system of claim 15, wherein the test signal is coded with a code.

20. The system of claim 19, wherein the code is one of a pseudorandom number code or a gold code.

21. The system of claim 19, wherein the test signal is a spread-spectrum modulated signal.

22. The system of claim 21, wherein the spread-spectrum signal is a chirped signal.

23. The system of claim 19, wherein the system further comprises a decoder configured to decode the response signal.

24. The system of claim 15, wherein the baseline signal is a function of at least one of an expected voltage for the battery, an expected temperature for the battery, or an expected impedance profile for the battery.

* * * * *